US010840562B2

(12) United States Patent
Shiraishi et al.

(10) Patent No.: US 10,840,562 B2
(45) Date of Patent: Nov. 17, 2020

(54) ENERGY STORAGE SYSTEM, MONITORING UNIT FOR ENERGY STORAGE DEVICE, AND METHOD OF MONITORING ENERGY STORAGE DEVICE

(71) Applicant: GS Yuasa International Ltd., Kyoto (JP)

(72) Inventors: Takeyuki Shiraishi, Kyoto (JP); Masashi Nakamura, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 1050 days.

(21) Appl. No.: 15/343,013

(22) Filed: Nov. 3, 2016

(65) Prior Publication Data

US 2017/0149096 A1    May 25, 2017

(30) Foreign Application Priority Data

Nov. 24, 2015    (JP) .................................. 2015-228539

(51) Int. Cl.
*H02J 7/00* (2006.01)
*H01M 10/42* (2006.01)
(Continued)

(52) U.S. Cl.
CPC ........ *H01M 10/425* (2013.01); *G01R 31/378* (2019.01); *G01R 31/382* (2019.01);
(Continued)

(58) Field of Classification Search
CPC combination set(s) only.
See application file for complete search history.

(56) References Cited

U.S. PATENT DOCUMENTS 6,625,553 B1 *   9/2003   Modgil ................... B60R 25/04
                                                                    307/10.7
9,065,291 B2 *   6/2015   Park ........................ B60L 58/15
(Continued)

FOREIGN PATENT DOCUMENTS

CN       103746422 A       4/2014
JP       H 07-29611 A      1/1995
(Continued)

OTHER PUBLICATIONS

Japanese Office Action dated May 9, 2019, in Japanese Patent Application No. 2015-228539 with an English translation.
(Continued)

*Primary Examiner* — Robert Grant
(74) *Attorney, Agent, or Firm* — McGinn I.P. Law group, PLLC

(57) ABSTRACT

An energy storage system includes an energy storage device; a current cutoff unit configured to cut off current of the energy storage device; a communication connector to be connected with an external communication connector; a detection terminal provided to the communication connector; and a control unit configured to control the current cutoff unit based on a connection state of the detection terminal of the communication connector when the communication connector is connected with the external communication connector. In a method of monitoring an energy storage device mounted on a vehicle, when a communication connector
(Continued)

including a detecting terminal is connected with an external communication connector of the vehicle, current between the energy storage device and the vehicle is cut off based on a connection state of the detection terminal.

15 Claims, 9 Drawing Sheets

(51) Int. Cl.
  *G01R 31/382* (2019.01)
  *G01R 31/378* (2019.01)
  *H01M 2/10* (2006.01)
  *H01M 10/0525* (2010.01)
  *H01M 10/48* (2006.01)

(52) U.S. Cl.
  CPC ..... *H01M 2/1077* (2013.01); *H01M 10/0525* (2013.01); *H01M 10/486* (2013.01); *H02J 7/0029* (2013.01); *H02J 7/0031* (2013.01); *H02J 7/0063* (2013.01); *H01M 2010/4271* (2013.01); *H01M 2220/20* (2013.01); *H02J 7/0048* (2020.01); *H02J 7/00302* (2020.01); *H02J 7/00306* (2020.01); *H02J 2007/0067* (2013.01)

(56) References Cited

U.S. PATENT DOCUMENTS

| | | | | |
|---|---|---|---|---|
| 2010/0304206 | A1* | 12/2010 | Nakashima | H01M 10/0525 429/156 |
| 2014/0306658 | A1* | 10/2014 | Kinomura | H02J 7/0027 320/109 |
| 2016/0003912 | A1 | 1/2016 | Iwane et al. | |

FOREIGN PATENT DOCUMENTS

| | | |
|---|---|---|
| JP | H 11-260424 A | 9/1999 |
| JP | 2000-152422 A | 5/2000 |
| JP | 2008-291660 A | 12/2008 |
| JP | 2009-004349 A | 1/2009 |
| JP | 2013-055832 A | 3/2013 |
| JP | 2013-538419 A | 10/2013 |
| JP | 2013-236465 A | 11/2013 |
| JP | 2014-082137 A | 5/2014 |
| JP | 2014-178213 A | 9/2014 |
| JP | 2015-206694 A | 11/2015 |
| WO | WO 2008/142811 A1 | 11/2008 |

OTHER PUBLICATIONS

Chinese Office Action dated May 24, 2019, in Chinese Patent Application No. 201611048905.1 with an English translation.

* cited by examiner

ENERGY STORAGE SYSTEM, MONITORING UNIT FOR ENERGY STORAGE DEVICE, AND METHOD OF MONITORING ENERGY STORAGE DEVICE

CROSS-REFERENCE TO RELATED APPLICATIONS

This application claims the benefit of Japanese patent application No. 2015-228539 filed on Nov. 24, 2015, which is incorporated by reference.

FIELD

The technique disclosed in the present specification relates to an energy storage system, an energy storage device monitoring unit, and a method of monitoring an energy storage device.

BACKGROUND

A lead-acid battery used as a start-up battery for a vehicle and the like, for example, is provided with a positive electrode terminal and a negative electrode terminal. The negative electrode terminal is connected with a battery sensor configured to monitor the state of the battery such as voltage or current for determining, for example, the residual capacity of the battery.

A vehicle control system is mounted on the vehicle and provided with a communication connector for a communication cable. The communication connector is connected with the battery sensor to monitor the state of the lead-acid battery by acquiring data from a microcomputer provided to the battery sensor. JP 2008-291660 A discloses such a technique. Typically, such a battery sensor is supplied with power from the positive electrode terminal through the system on the vehicle and the communication connector.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

Recently, in place of the lead-acid battery, an energy storage device (for example, a lithium ion battery) has been mounted on a vehicle to improve the fuel consumption of the vehicle. The lead-acid battery and the lithium ion battery are controlled in different manners, but both have the same shape when used as start-up batteries, and the communication connector has the same shape for both of the batteries. This may cause the lithium ion battery to be mounted on a vehicle on which the lead-acid battery should be mounted. In this case, for example, when the lithium ion battery is charged, overcharge may occur because the lead-acid battery typically has a higher charge voltage range than that of the lithium ion battery, which may cause fault of the battery.

The present specification discloses a technique for preventing misuse of an energy storage device.

The technique disclosed in the present specification is an energy storage system including an energy storage device, a current cutoff unit configured to cut off current of the energy storage device, a communication connector to be connected with an external communication connector, a detection terminal provided to the communication connector, and a control unit configured to control the current cutoff unit based on a connection state of the detection terminal of the communication connector when the communication connector is connected with the external communication connector.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Outline of Embodiments

Figure 1:
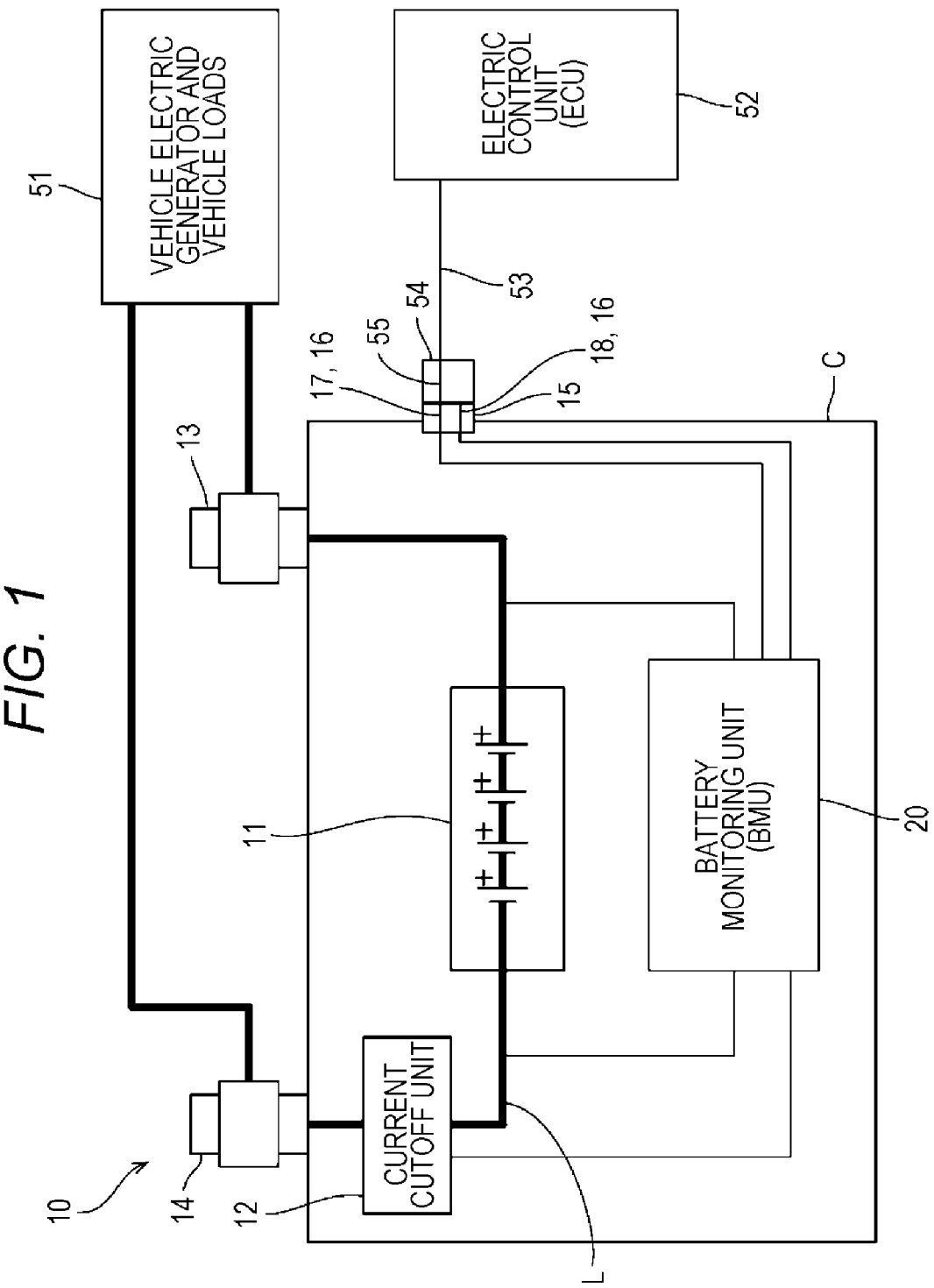
FIG. 1 is a block diagram of a battery system according to a first embodiment.

The outline of an energy storage system disclosed in the present embodiment will be first described.

The energy storage system disclosed in the present embodiment includes an energy storage device which is chargeable, a current cutoff unit configured to cut off current of the energy storage device, a communication connector to be connected with an external communication connector, a detection terminal provided to the communication connector, and a control unit configured to control the current cutoff unit based on a connection state of the detection terminal of the communication connector when the communication connector is connected with the external communication connector.

In the energy storage system with such a configuration, for example, when the communication connector is connected with the external communication connector, the control unit actuates the current cutoff unit based on the connection state of the terminal of the communication connector to cut off the current of the energy storage device or cancel the cutoff of the current. With this configuration, when a plurality of external communication connectors with different configurations are provided and the connection state of the detection terminal varies between these external communication connectors being connected with the communication connector, the current can be cut off based on the connection state of the detection terminal upon connection with an inappropriate external communication connector, thereby preventing misuse of the energy storage deivce.

The energy storage system disclosed in the present specification may have the following configuration.

According to an aspect of the energy storage system disclosed in the present specification, the communication connector may be connectable with the external communication connector provided to a vehicle having an identical charge voltage range and the external communication connector provided to a vehicle having a different charge voltage range, the detection terminal may be connectable with a power terminal for power supply provided to the external communication connector of the vehicle having a different charge voltage range, and the control unit may cause the current cutoff unit to cut off the current when the communication connector is connected with the external communication connector and the detection terminal is connected with the power terminal.

With this configuration, for example, when the energy storage system is mounted on the vehicle having a different charge voltage range, and it is detected that the detection terminal of the communication connector is connected with the power terminal of the external communication connector, the current cutoff unit cuts off current between the energy storage and the vehicle. The vehicle includes a manned vehicle and an unmanned vehicle, for example, automatic guided vehicle (AVG). The vehicle also includes a four-wheeled vehicle, a three-wheeled vehicle, two-wheeled vehicle or the like. Specifically, the vehicle includes a car, a motorbike, a cart and a forklift or the like.

Thus, when the energy storage system is mounted on the vehicle having a different charge voltage range, the current cutoff unit cuts off the current to prevent use of the energy storage device. When the energy storage system is mounted on the vehicle having an identical charge voltage range and the communication connector is connected with the external communication connector, the connection between the detection terminal and the power terminal is not detected and the current is not cut off, allowing use of the energy storage device. This configuration can prevent misuse of the energy storage device of the energy storage system.

According to another aspect of the energy storage system disclosed in the present specification, the control unit may cause the current cutoff unit to cancel the cutoff of the current when the connection between the communication connector and the external communication connector is canceled and the connection between the detection terminal and the power terminal is canceled.

With this configuration, when the energy storage system is removed from a vehicle controlled in a different manner, the connection between the detection terminal and the power terminal is canceled and the cutoff of the current is canceled at the current cutoff unit. Thus, the energy storage device can be easily returned to a usable state without separately performing a cancel operation to cancel the cutoff of the current at the current cutoff unit.

According to another aspect of the energy storage system disclosed in the present specification, the detection terminal may be connectable with a ground terminal for grounding provided to the external communication connector of the vehicle having an identical charge voltage range, and the control unit may be configure to cancel the cutoff of the current at the current cutoff unit when the communication connector is connected with the external communication connector, and a connection between the detection terminal and the ground terminal is detected.

With this configuration, when the energy storage system is mounted on the vehicle having an identical charge voltage range, the connection between the detection terminal of the communication connector and the ground terminal of the external communication connector is detected, the current cutoff unit cancels the cutoff of the current so that the energy storage device is returned to a usable state and can be used.

According to another aspect of the energy storage system disclosed in the present specification, the communication connector may include a communication terminal connectable with the external communication terminal provided to the external communication connector, and the control unit may cause the current cutoff unit to cut off the current when a cutoff signal from the external communication connector to the communication terminal is detected while the communication terminal is connected with the external communication terminal through the connection between the communication connector and the external communication connector.

With this configuration, when the cutoff signal is transmitted from the external communication connector to the control unit through the external communication terminal and the communication terminal, the current can be cut off in response to an external instruction, thereby allowing appropriate use of the energy storage device of the energy storage system.

The technique disclosed in the present specification can prevent misuse of a energy storage device.

First Embodiment

The first embodiment disclosed in the present specification will be described with reference to FIGS. 1 to 5.

The energy storage device is a chargeable energy storage device but not limited thereto. The energy storage device may be a secondary battery or a capacitor. When the secondary battery is used as the energy storage device, the energy storage system according to the present invention is a battery system. Hereinafter, the battery system in which a lithium ion secondary battery is used as the energy storage device is explained.

The following first describes a battery system 10 according to the present embodiment. The battery system 10 according to the present embodiment is a start-up battery system mounted on a vehicle such as an automobile. As illustrated in FIG. 1, the battery system 10 is configured to supply electrical power to various vehicle loads 51 such as an engine start-up device connected with a negative electrode terminal 13 and a positive electrode terminal 14 of the battery system 10, and receive electrical power from a vehicle electric generator 51.

The battery system 10 includes a secondary battery 11, a current sensor (not illustrated), a temperature sensor (not illustrated), a voltage sensor (not illustrated), a current cutoff unit 12, and a battery monitoring unit (hereinafter referred to as a "BMU") 20.

The secondary battery 11 includes a plurality (in the present embodiment, four) of lithium ion batteries connected in series, and has its negative electrode connected with the negative electrode terminal 13 and its positive electrode connected with the positive electrode terminal 14. Thus, the battery system 10 according to the present embodiment is mounted and used on a lithium ion battery dedicated vehicle to be described later.

The current sensor is connected with an electrical power line L between the secondary battery 11 and the negative electrode terminal 13, and configured to detect current flowing through the electrical power line L and output a detection signal in accordance with the detected current.

The temperature sensor is of a contact type or a non-contact type, and configured to measure the temperature of the secondary battery 11 and output a temperature measurement signal in accordance with the measured temperature.

The voltage sensor is connected with the secondary battery 11 in parallel, and configured to detect voltage between terminals of the secondary battery 11 and output a detection signal in accordance with the detected voltage.

The current sensor, the temperature sensor, and the voltage sensor are connected with the BMU 20 through a signal line (not illustrated) so that a signal output by each sensor is acquired by the BMU 20.

The current cutoff unit 12 is, for example, a semiconductor switch such as a FET, or a relay, and provided on the electrical power line L between the secondary battery 11 and the positive electrode terminal 14. The current cutoff unit 12 is actuated to cut off current through the electrical power line L between the secondary battery 11 and the positive electrode terminal 14 in response to a command from the BMU 20.

Figure 2:
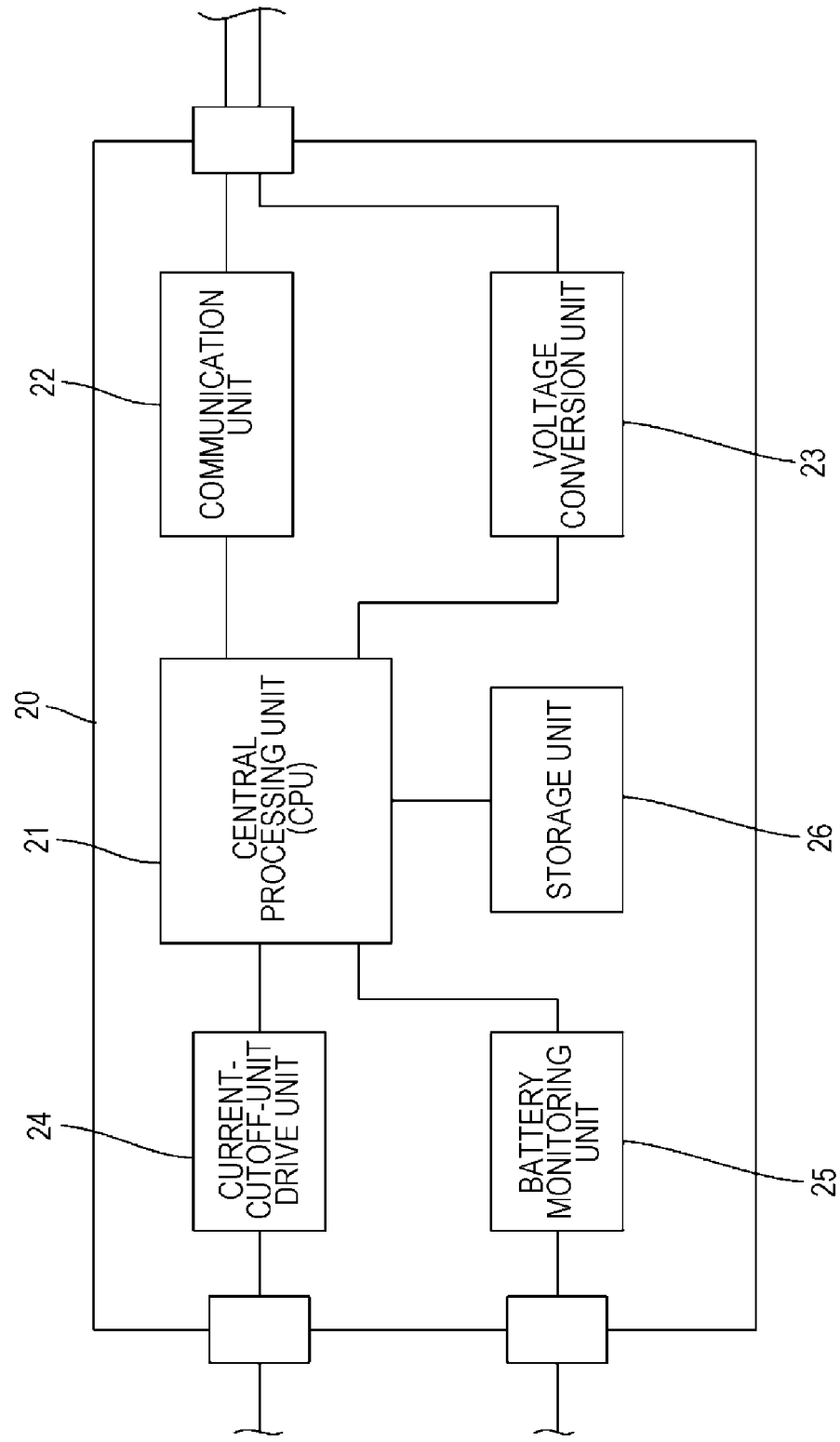
FIG. 2 is a block diagram of a monitoring unit of an energy storage device.

The BMU 20 is connected with the secondary battery 11 and the current cutoff unit 12 in a case C of the battery system 10, and also connected with a communication connector 15 provided to the case C. The BMU 20 receives supply of electrical power directly from the secondary battery 11. As illustrated in FIG. 2, the BMU 20 includes a central processing unit (hereinafter referred to as a "CPU") 21, a communication unit 22, a voltage conversion unit 23, a current-cutoff-unit drive unit 24, a battery monitoring unit 25, and a storage unit 26. The central processing unit 21 corresponds to the control unit.

The communication connector 15 includes a plurality (in the present embodiment, two) of terminals 16, and is connectable with a vehicle-side communication connector 54 of a communication cable 53 provided to an electric control unit (hereinafter referred to as an "ECU") 52 of the vehicle as illustrated in FIGS. 1 and 2. One of the plurality of terminals 16 of the communication connector 15 serves as a communication terminal 17 to be connected with a vehicle-side communication terminal 55 provided to the vehicle-side communication connector 54. The communication terminal 17 and the vehicle-side communication terminal 55 are connected with each other through connection between the communication connector 15 and the vehicle-side communication connector 54. Another terminal of the plurality of terminals 16, which is different from the communication terminal 17, serves as a detection terminal 18.

The communication unit 22 has one of its ends connected with the CPU 21, and the other end connected with the communication terminal 17 of the communication connector 15. When the communication connector 15 is connected with the vehicle-side communication connector 54 and the communication terminal 17 is connected with the vehicle-side communication terminal 55, the communication unit 22 becomes ready for communication with the ECU 52 of the vehicle, and transmit and receive a signal or data between the CPU 21 and the ECU 52.

The voltage conversion unit 23 is, for example, a semiconductor switch such as a FET, and has one of its ends connected with the CPU 21, and the other end connected with the detection terminal 18 provided to the communication connector 15. When no power is input to the detection terminal 18, the voltage conversion unit 23 inputs a non-detection signal to the CPU 21. When power is input to the detection terminal 18 and, for example, the semiconductor switch is switched upon increase in the voltage of the detection terminal 18 or flow of current through the detection terminal 18, the voltage conversion unit 23 inputs the detection signal to the CPU 21. Then, upon cancellation of the power input to the detection terminal 18 and hence decrease in the voltage of the detection terminal 18, the semiconductor switch is switched so that the voltage conversion unit 23 resumes inputting of the non-detection signal to the CPU 21 again.

The current-cutoff-unit drive unit 24 receives a current cutoff command or a current cutoff cancellation command from the CPU 21, and outputs driving current to the current cutoff unit 12 in accordance with the command.

The battery monitoring unit 25 monitors the state of the secondary battery 11 based on the signal from each sensor acquired by the BMU 20, and outputs a result of the monitoring to the CPU 21.

The storage unit 26 stores therein various programs for controlling operation of the BMU 20.

Figure 3:
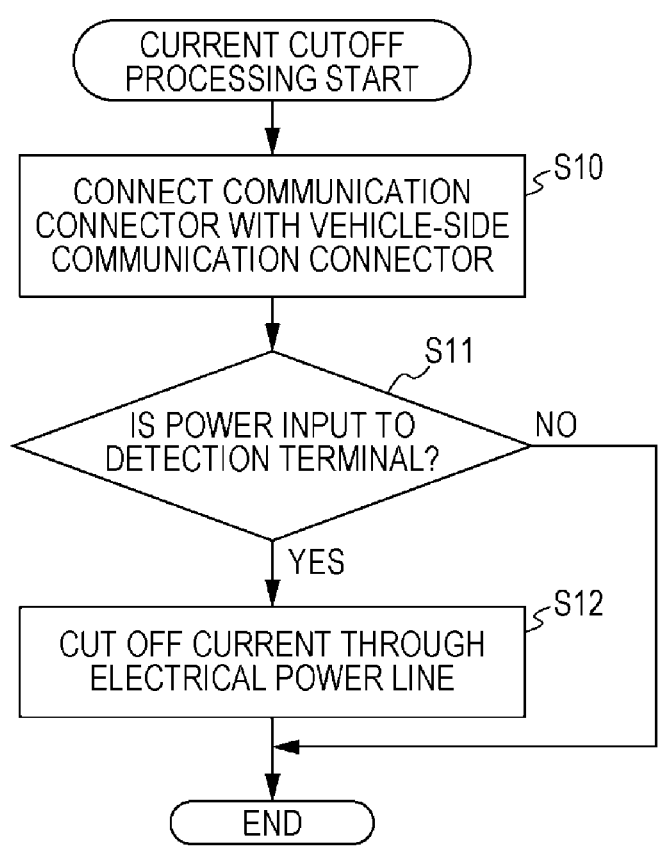
FIG. 3 is a flowchart of current cutoff processing.
Figure 4:
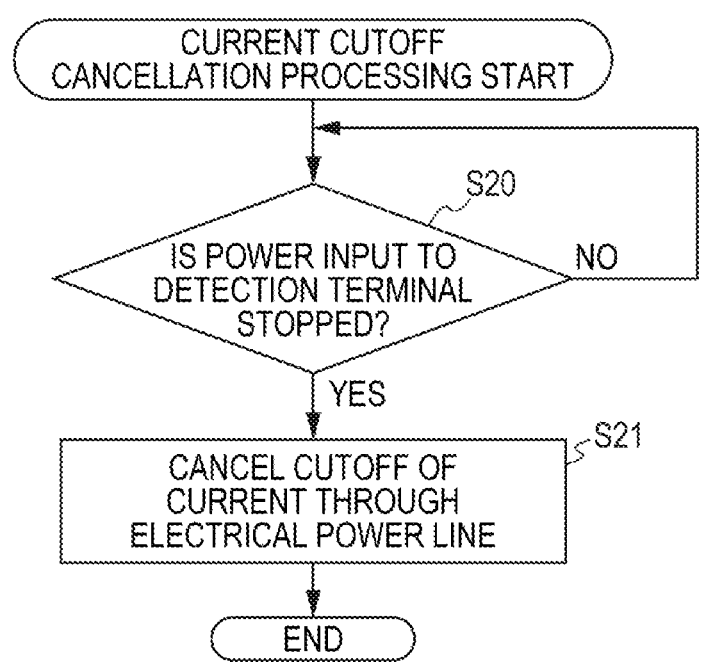
FIG. 4 is a flowchart of current cutoff cancellation processing.
Figure 5:
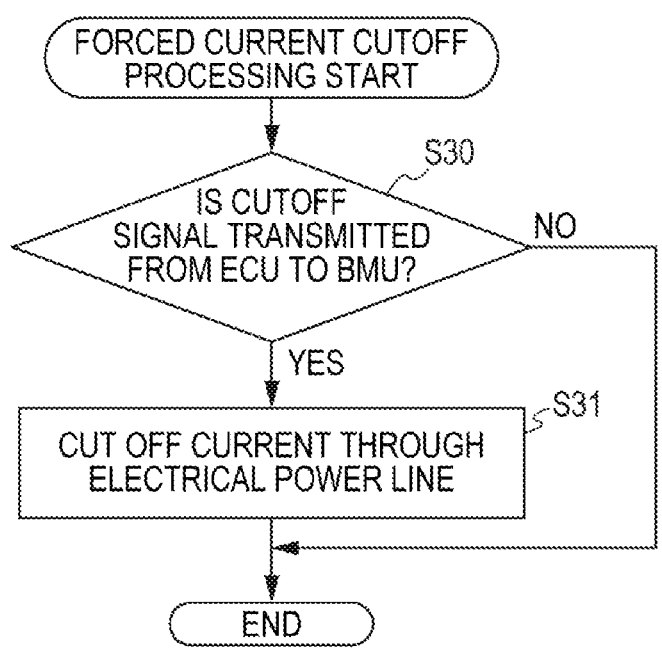
FIG. 5 is a flowchart of forced current cutoff processing.

The CPU 21 monitors and controls each component, which involves current cutoff processing and current cutoff cancellation processing illustrated in FIGS. 3 to 5 based on various kinds of received signal and data and the program read from the storage unit 26.

The following describes the current cutoff processing. As illustrated in FIG. 3, in the current cutoff processing, first, the battery system 10 is mounted on a vehicle, and the communication connector 15 is connected with the vehicle-side communication connector 54 of the vehicle (S10). When the communication connector 15 is connected with the vehicle-side communication connector 54, the CPU 21 determines whether power is input to the detection terminal 18 of the communication connector 15 (S11).

Specifically, the battery system 10 is mounted on the vehicle, and the communication connector 15 is connected with the vehicle-side communication connector 54 of the vehicle. Then, when power is input to the detection terminal 18, the voltage conversion unit 23 inputs the detection signal to the CPU 21.

When the CPU 21 determines that power is input to the detection terminal 18 upon inputting of the detection signal, the CPU 21 outputs a cutoff command to the current cutoff unit 12 through the current-cutoff-unit drive unit 24, and cut off current at the current cutoff unit 12 through the electrical power line L between the secondary battery 11 and the positive electrode terminal 14 (S12).

Accordingly, current between the secondary battery 11 and the vehicle is cut off, and thus the electrical power supply from the battery system 10 to the vehicle loads 51 and the electrical power supply from the vehicle electric generator 51 to the battery system 10 are prevented.

When the communication connector 15 is connected with the vehicle-side communication connector 54 but no power is input to the detection terminal 18, the non-detection signal from the voltage conversion unit 23 is continuously input to the CPU 21, and the processing in S11 ends. Accordingly, the current through the electrical power line L between the secondary battery 11 and the positive electrode terminal 14 is not cut off by the current cutoff unit 12, so that electrical power is supplied from the secondary battery 11 to the various vehicle loads 51 of the vehicle and from the vehicle electric generator 51 to the secondary battery 11.

The following describes the current cutoff cancellation processing.

As described above, when the current through the electrical power line L is cut off through the current cutoff processing, no electrical power is supplied from the battery system 10 to the vehicle loads 51 and from the vehicle electric generator 51 to the battery system 10. Then, the CPU 21 performs the current cutoff cancellation processing to return the battery system 10 to the usable state.

In the current cutoff cancellation processing, as illustrated in FIG. 4, the CPU 21 determines whether the power input to the detection terminal 18 is stopped (S20). Specifically, when the vehicle-side communication connector 54 is removed from the communication connector 15 of the battery system 10 and the power input to the detection terminal 18 is stopped, the voltage conversion unit 23 resumes inputting of the non-detection signal to the CPU 21.

When the CPU 21 determines that the power input to the detection terminal 18 is stopped upon the inputting of the non-detection signal, the CPU 21 outputs a cutoff cancellation command to the current cutoff unit 12 so as to cancel the cutoff of the current through the electrical power line L between the secondary battery 11 and the positive electrode terminal 14 (S21). Accordingly, the battery system 10 can be returned to the usable state.

When the power input to the detection terminal 18 is not stopped, the non-detection signal from the voltage conversion unit 23 is not input to the CPU 21, and thus the CPU 21 repeats the processing in S20 until the power input to the detection terminal 18 is stopped and the non-detection signal is input to the CPU 21.

When the ECU 52 of the vehicle determines that current between the vehicle and the battery system 10 needs to be cut off although no power is input to the detection terminal 18 and the non-detection signal is continuously input to the CPU 21 from the voltage conversion unit 23, the following forced current cutoff processing may be executed.

In the forced current cutoff processing, when the battery system 10 is mounted on the vehicle, the communication connector 15 is connected with the vehicle-side communication connector 54 of the vehicle, and the communication terminal 17 is connected with the vehicle-side communication terminal 55, the CPU 21 determines whether the cutoff signal is input from the ECU 52 of the vehicle to the CPU 21 of the BMU 20 as illustrated in FIG. 5 (S30).

Specifically, when the cutoff signal is input from the ECU 52 of the vehicle to the BMU 20, the cutoff signal is input to the CPU 21 through the communication unit 22. Upon the inputting of the cutoff signal from the ECU 52, the CPU 21 determines that the cutoff signal is the cutoff command from the ECU 52 of the vehicle, and inputs the cutoff command to the current cutoff unit 12 to cut off the current through the electrical power line L between the secondary battery 11 and the positive electrode terminal 14 (S31).

In this manner, when the ECU 52 of the vehicle determines that the current between the secondary battery 11 and the vehicle loads 51 or the vehicle electric generator 51 needs to be cut off while no power is input to the detection terminal 18 and the non-detection signal is continuously input from the voltage conversion unit 23 to the CPU 21, the current through the electrical power line L between the secondary battery 11 and the positive electrode terminal 14 can be cut off through the forced current cutoff processing to prevent use of the battery system 10.

Figure 6:
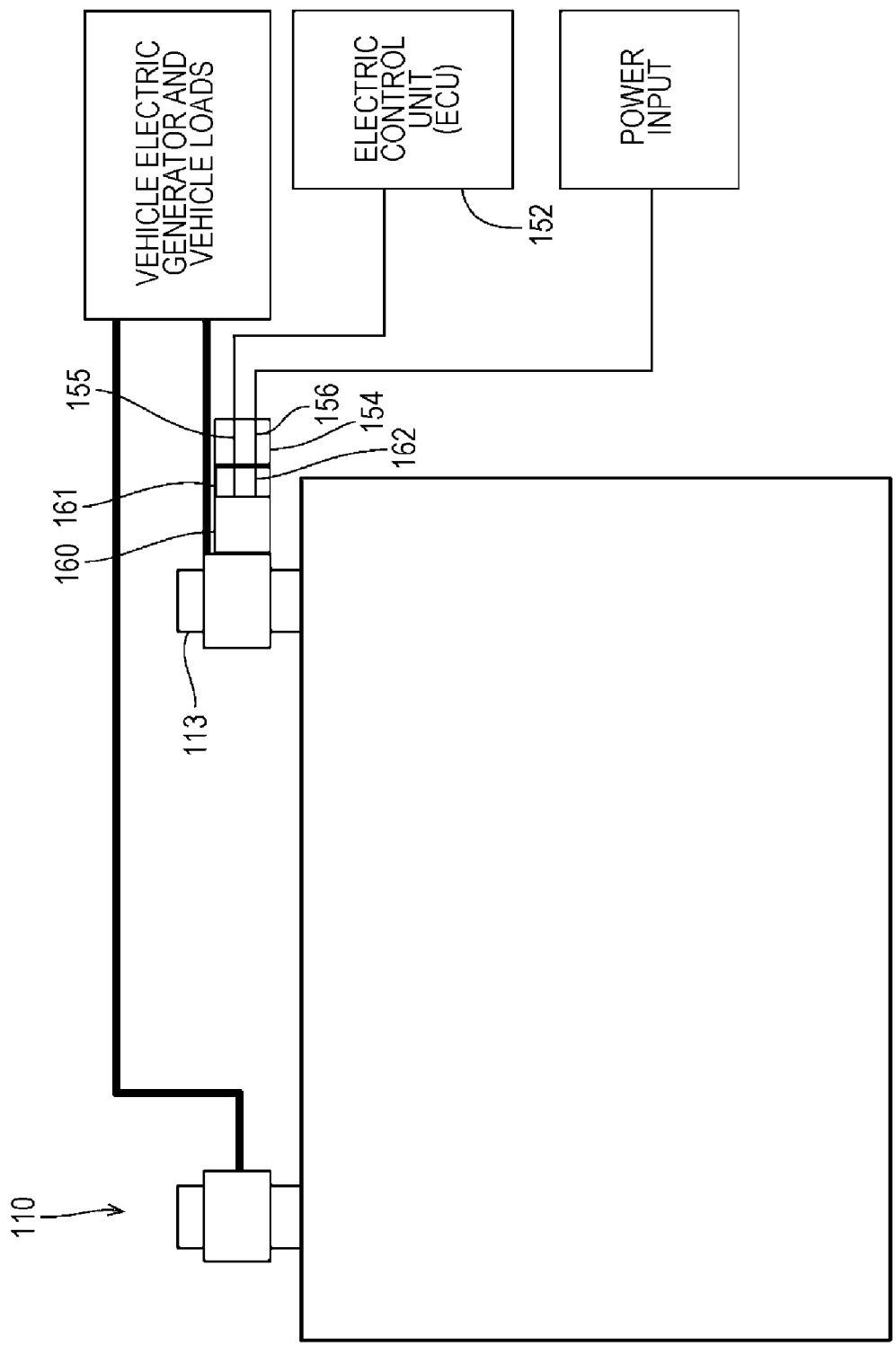
FIG. 6 is a block diagram illustrating a connection state of a lead-acid battery system and a lead-acid battery dedicated vehicle.
Figure 7:
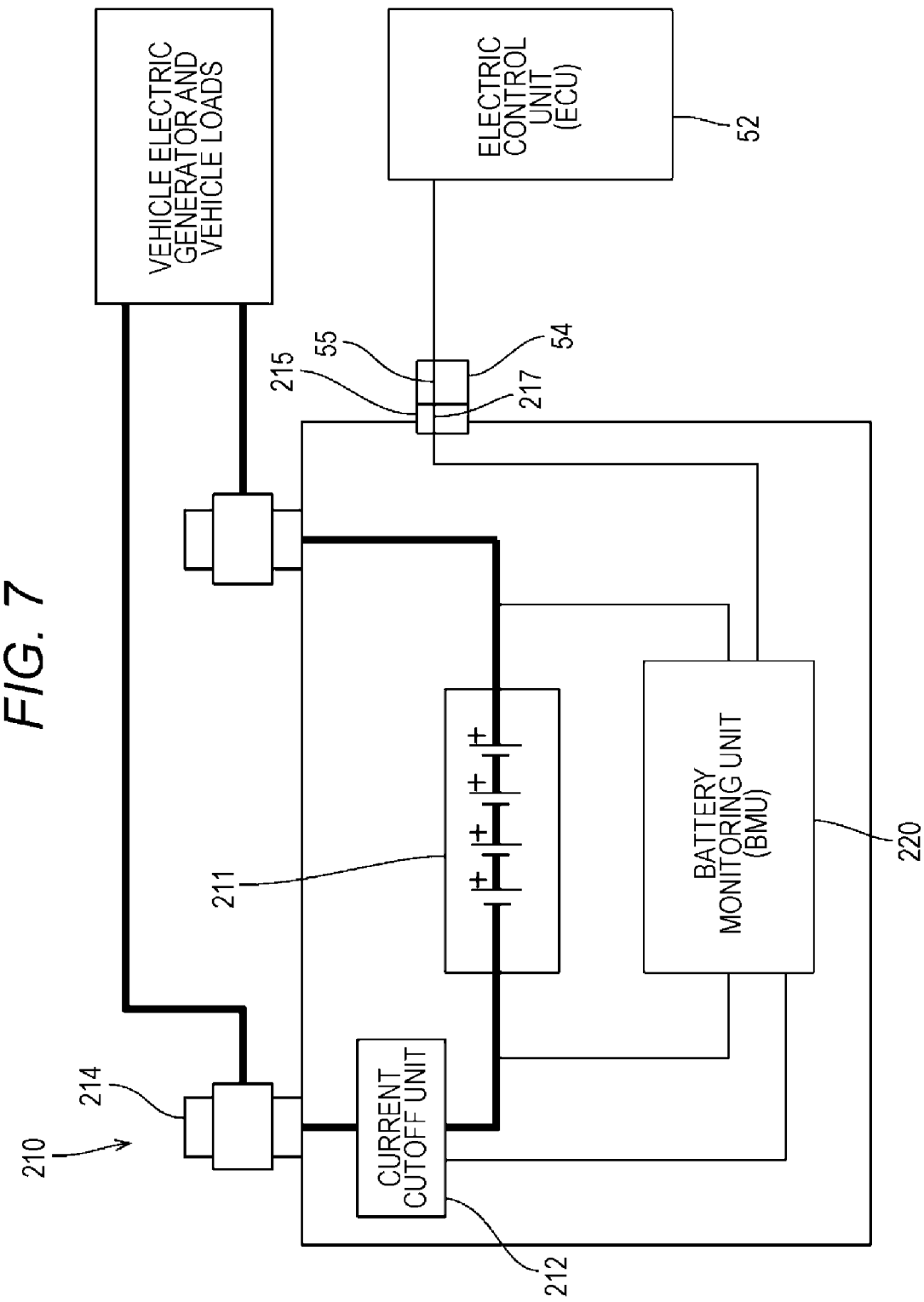
FIG. 7 is a block diagram illustrating a connection state of a conventional lithium ion battery system and a lithium ion battery dedicated vehicle.

The above has described the configuration of the present embodiment, and the following describes any effect of the battery system 10. Prior to the description of the effect of the battery system 10 according to the present embodiment, as illustrated in FIGS. 6 and 7, the following describes differences in configuration and charge voltage range between a start-up lead-acid battery system 110 employing a lead-acid battery and a conventional start-up lithium ion battery system 210 employing a lithium ion battery. The following also describes a difference between a lead-acid battery dedicated vehicle and a lithium ion battery dedicated vehicle on which the battery systems 110 and 210 are mounted, respectively.

Typically, the lead-acid battery has a high resistance against overcharge and a high internal resistance, and thus the charge voltage range of the lead-acid battery can be set to be high. Thus, for example, when a secondary battery including four lithium ion batteries connected in series and a full charge voltage per battery is 3.5 volts, the charge voltage range of the secondary battery is set to the vicinity of 14 volts. However, the charge voltage range for a lead-acid battery having a full charge voltage of 12 volts is set to, for example, the vicinity of 14.8 volts. Thus, typically, the lead-acid battery dedicated vehicle has a charge voltage range set higher than that of the lithium ion battery dedicated vehicle.

The lead-acid battery system 110 is provided with no cutoff unit nor BMU in the lead-acid battery system 110, but, for example, a battery sensor 160 configured to monitor the state of the battery such as voltage or current is attached to a negative electrode terminal 113 as illustrated in FIG. 6. The battery sensor 160 is provided with a communication connector 161, which is connected with a vehicle-side communication connector 154 of the lead-acid battery dedicated vehicle so as to monitor the state of the lead-acid battery system 110 through an ECU 152 of the vehicle. When the communication connector 161 is connected with the vehicle-side communication connector 154, a power terminal for power supply 156 provided to the vehicle-side communication connector 154 is connected with a sensor-side terminal 162 provided to the communication connector 161 so that the battery sensor 160 is supplied with electrical power from the lead-acid battery system 110 through the vehicle. Thus, the vehicle-side communication connector 154 of the lead-acid battery dedicated vehicle is provided with two terminals of a vehicle-side communication terminal 155 for monitoring the lead-acid battery system 110 and the power terminal 156 for supplying power to the battery sensor 160.

In order to prevent overcharge and overdischarge of a secondary battery 211, the lithium ion battery system 210 employing the conventional lithium ion battery includes therein a battery monitoring unit 220 configured to monitor the voltage, current, temperature, and the like of the secondary battery 211, and a current cutoff unit 212 as illustrated in FIG. 7. The battery monitoring unit 220 is supplied with power directly from the secondary battery 211 in the lithium ion battery system 210. When the battery monitoring unit 220 detects overcharge and overdischarge of the secondary battery 211, the current cutoff unit 212 cuts off current between the secondary battery 211 and a positive electrode terminal 214. The battery monitoring unit 220 includes a communication connector 215 including a communication terminal 216. When this communication connector 215 is connected with the vehicle-side communication connector 54 of the lithium ion battery dedicated vehicle and the communication terminal 216 is connected with the vehicle-side communication terminal 55 of the vehicle-side communication connector 54, the battery monitoring unit 220 and the ECU 52 of the vehicle can be communicated with each other.

As described above, the vehicle-side communication connector 54 of the lithium ion battery dedicated vehicle is provided with the vehicle-side communication terminal 55 for communication with the lithium ion battery system 210, but is provided with no power terminal for supplying power to the communication connector 215. This configuration allows communication between the vehicle and the lithium ion battery system 210 when connection is established only between a communication terminal 217 of the communication connector 15 in the lithium ion battery system 210 and the vehicle-side communication terminal 55 of the vehicle-side communication connector 54 in the vehicle.

In general, every start-up battery system is intended to be mounted on a vehicle, and thus substantially has an identical shape. This may cause the lithium ion battery system to be wrongly mounted on the lead-acid battery dedicated vehicle. As a result, when the lithium ion battery system is wrongly mounted on the lead-acid battery dedicated vehicle and the lithium ion battery is charged, the secondary battery is overcharged and failed since the lead-acid battery has a charge voltage range set to be higher than the charge voltage range of the lithium ion battery.

However, when the battery system 10 according to the present embodiment is mounted on the lead-acid battery dedicated vehicle and the communication connector 15 is connected with the vehicle-side communication connector 154, the communication terminal 17 of the communication connector 15 is connected with the vehicle-side communication terminal 55 of the vehicle-side communication connector 54, and the detection terminal 18 of the communication connector 15 is connected with the power terminal 156 of the vehicle-side communication connector 154, whereby power is input to the detection terminal 18 of the communication connector 15.

Upon the power input to the detection terminal 18, the detection terminal 18 and the power terminal 156 is detected to be in a connected state based on increase in the voltage of the detection terminal 18 and flow of current through the detection terminal 18. Accordingly, the voltage conversion unit 23 inputs the detection signal to the CPU 21, and the current cutoff processing is executed. In the current cutoff processing, the CPU 21 determines that power is input to the detection terminal 18 upon the inputting of the detection signal, and outputs the cutoff command to the current cutoff unit 12 through the current-cutoff-unit drive unit 24. Then, when the current cutoff unit 12 receives the cutoff command, the current cutoff unit 12 cuts off the current through the electrical power line L between the secondary battery 11 and the positive electrode terminal 14.

Thus, when the current through the electrical power line L between the secondary battery 11 and the vehicle is cut off, no electrical power is supplied from the battery system 10 to the vehicle loads 51 and from the vehicle electric generator 51 to the battery system 10, thereby preventing any fault due to overcharge caused by wrongly charging the lithium ion battery.

In contrast, when the battery system 10 according to the present embodiment is mounted on the lithium ion battery dedicated vehicle and the communication connector 15 is connected with the vehicle-side communication connector 54, the communication terminal 17 of the communication connector 15 is connected with the vehicle-side communication terminal 55 of the vehicle-side communication connector 54, but the detection terminal 18 of the communication connector 15 is connected with no power terminal. Accordingly, the non-detection signal is continuously input to the CPU 21 from the voltage conversion unit 23.

Thus, the current through the electrical power line L between the secondary battery 11 and the positive electrode terminal 14 is not cut off by the current cutoff unit 12, and electrical power is supplied from the secondary battery 11 to the various vehicle loads 51 of the vehicle and from the vehicle electric generator 51 to the secondary battery 11. This configuration allows use of the battery system 10 in a similar manner to the conventional lithium ion battery system.

In order to cancel the cutoff of the battery system 10 in which the current through the electrical power line L is cut off when the battery system 10 is mounted on the lead-acid battery dedicated vehicle, the vehicle-side communication connector 54 is removed from the communication connector 15 so as to execute the current cutoff cancellation processing.

When the connection between the communication connector 15 and the vehicle-side communication connector 154 is canceled, the connection between the detection terminal 18 and the power terminal 156 is canceled accordingly, so that the power input to the detection terminal 18 is stopped. Then, upon the stopping of the power input to the detection terminal 18, the voltage conversion unit 23 resumes inputting of the non-detection signal to the CPU 21. When the CPT 21 receives the non-detection signal, the CPU 21 determines that the power input to the detection terminal 18 is stopped, and outputs the cutoff cancellation command to the current cutoff unit 12. When the current cutoff unit 12 receives the cutoff cancellation command, the current cutoff unit 12 cancels the cutoff of the current through the electrical power line L between the secondary battery 11 and the positive electrode terminal 14. Accordingly, the battery system 10 can be returned to the usable state.

As described above, in the battery system 10 according to the present embodiment, the cutoff of the current through the electrical power line L or the cancellation of the current cutoff can be performed based on the state of the power input to the detection terminal 18. With this configuration, the battery system 10 can be prevented from misuse thereof and easily returned to the usable state when the battery system 10 is mounted on the lead-acid battery dedicated vehicle having a different charge voltage range.

When the battery system 10 according to the present embodiment has not been used for a long time in the usable state being mounted on the lithium ion battery dedicated vehicle, the secondary battery 11 is discharged for a long time without being charged, and thus performance thereof cannot be sufficiently obtained.

According to the present embodiment, when it is determined that the battery system 10 is not used for a long time by a user such as a driver or a worker and the performance of the secondary battery 11 cannot be sufficiently obtained if the secondary battery 11 is maintained in the usable state, the cutoff signal is input from the ECU 52 of the vehicle to the BMU 20 through an operation of, for example, a switch provided in the vehicle, and then the forced current cutoff processing is executed.

When the secondary battery 11 is in the usable state being mounted on the lithium ion battery dedicated vehicle, but information on the secondary battery 11 transmitted from the secondary battery 11 to the vehicle is different from valid information (for example, the type of the battery), the cutoff signal is input from the ECU 52 of the vehicle to the BMU 20 so as to execute the forced current cutoff processing as protection against unauthorized modification such as cutoff of the power terminal performed at the time of maintenance.

In the forced current cutoff processing, the cutoff signal is input from the ECU 52 of the vehicle to the BMU 20, and then to the CPU 21 through the communication unit 22. Having received the cutoff signal, the CPU 21 determines that the cutoff signal is the cutoff command from the ECU 52, and inputs the cutoff command to the current cutoff unit 12 through the current-cutoff-unit drive unit 24. Then, having received the cutoff command, the current cutoff unit 12 cuts off the current through the electrical power line L between the secondary battery 11 and the positive electrode terminal 14.

In this manner, the current through the electrical power line L between the secondary battery 11 and the positive electrode terminal 14 is forcibly cut off through the forced current cutoff processing to put the secondary battery in an unusable state before the secondary battery 11 becomes overdischarged although the battery system 10 is in the usable state being mounted on the lithium ion battery dedicated vehicle. This can prevent a situation that the performance of the secondary battery 11 is not sufficiently obtained and hence the battery system 10 is not used.

Second Embodiment

Figure 8:
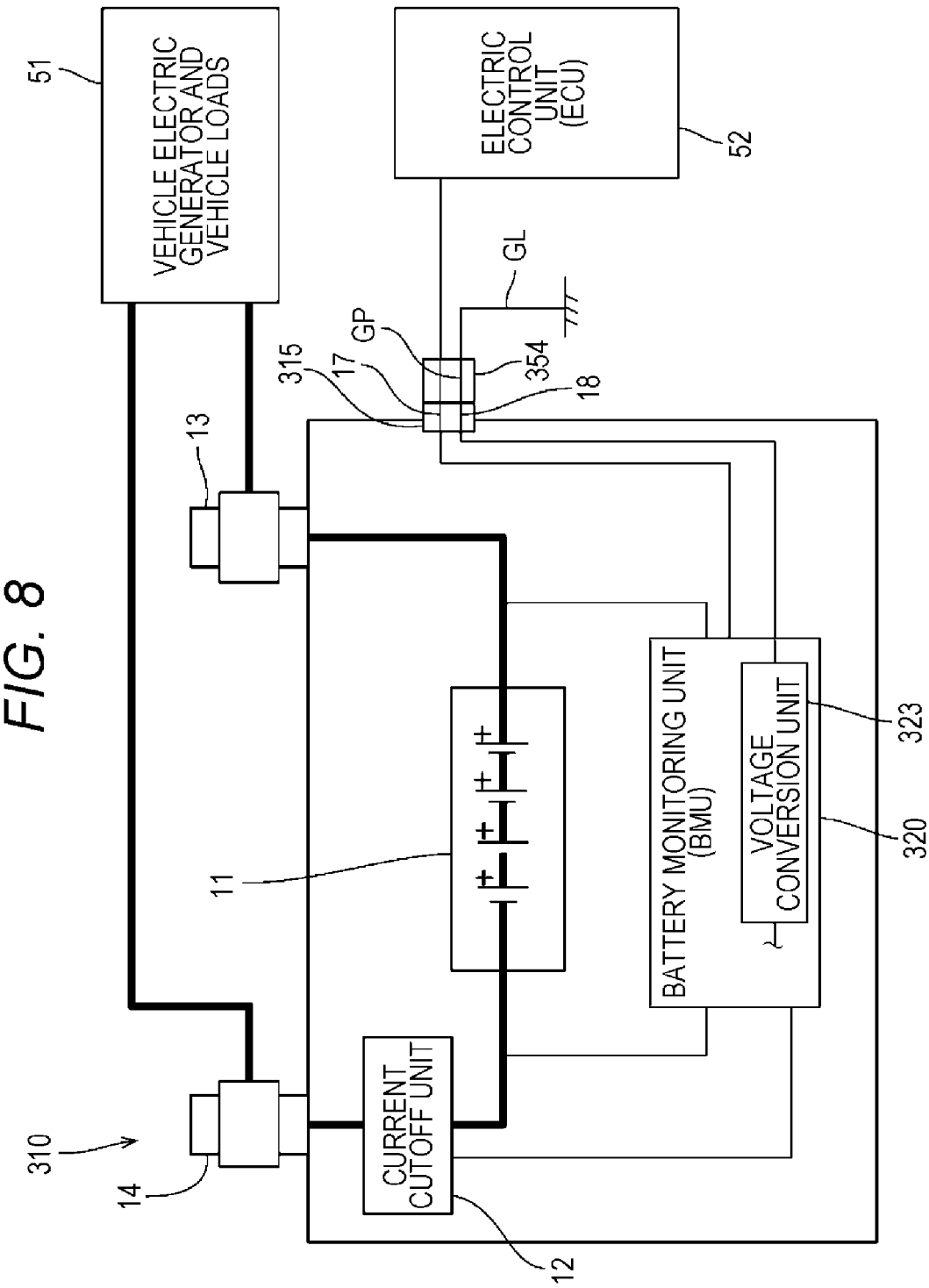
FIG. 8 is a block diagram of a battery system according to a second embodiment.

Next, the second embodiment will be described with reference to FIGS. 8 and 9.

In a battery system 310 according to the second embodiment, the voltage conversion unit 23 of the battery monitoring unit 220 in the first embodiment has a different configuration, and the current cutoff cancellation processing is performed by a different method. Any configuration and effect of the second embodiment identical to those of the first embodiment will not be described below to avoid duplication. Any component identical to that of the first embodiment will be denoted by an identical reference numeral.

A voltage conversion unit 323 in a battery monitoring unit 320 according to the second embodiment inputs the non-detection signal to the CPU 21 when the detection terminal 18 is grounded and the voltage of the detection terminal 18 decreases. The voltage conversion unit 323 inputs the detection signal to the CPU 21 when power is input to the detection terminal 18 and the voltage of the detection terminal 18 increases.

Figure 9:
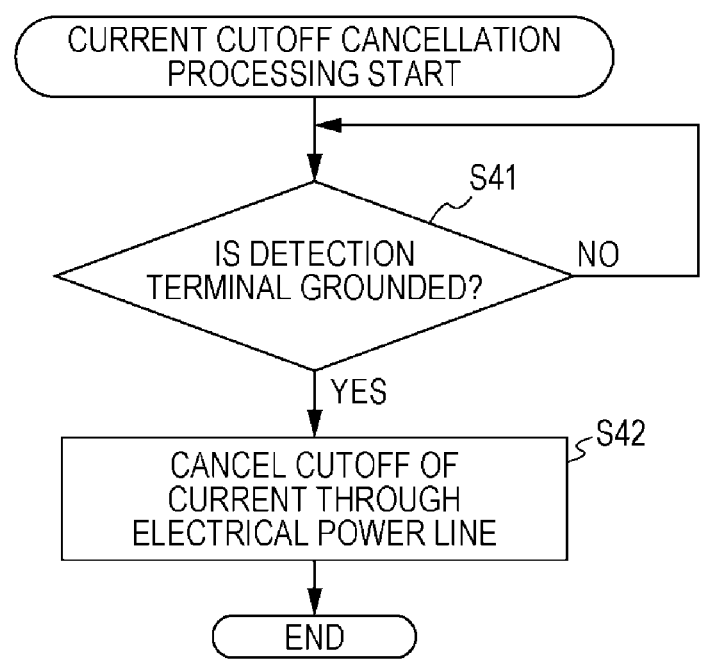
FIG. 9 is a flowchart of current cutoff cancellation processing in the battery system according to the second embodiment.

Thus, the current cutoff cancellation processing in the battery monitoring unit 320 starts with determination by the CPU 21 of whether the detection terminal 18 is grounded, as illustrated in FIG. 9 (S41). Specifically, for example, when the detection terminal 18 of a communication connector 315 is connected with a ground terminal GP of a vehicle-side communication connector 354, which is connected with a ground line GL of the vehicle, while no connection is made with the detection terminal 18 but the non-detection signal is continuously input to the CPU 21, as illustrated in FIG. 8, the voltage of the detection terminal 18 decreases to switch the semiconductor switch, and accordingly the voltage conversion unit 23 inputs a ground detection signal to the CPU 21.

Having determined that the detection terminal 18 is grounded upon the inputting of the ground detection signal, the CPU 21 transmits the cutoff cancellation command to the current cutoff unit 12 so as to cancel the cutoff of the current through the electrical power line L between the secondary battery 11 and the positive electrode terminal 14 (S42). Accordingly, the battery system 310 can be returned to the usable state.

Thus, according to the present embodiment, the current cutoff by the current cutoff unit 12 is not canceled, for example, even when the vehicle-side communication connector of the lead-acid battery dedicated vehicle is removed from the communication connector 315 of the battery system 310. However, the current cutoff by the current cutoff unit 12 is canceled when the communication connector 315 is connected with the vehicle-side communication connector 354 provided with the ground terminal GP, and accordingly, the battery system 310 can be used.

Other Embodiments

The technique disclosed in the present specification is not limited to the embodiments in the above description with reference to the drawings, but includes various kinds of modifications as follows.

(1) In the above-described embodiments, the secondary battery 11 is a lithium ion battery, and the BMU 20 is provided in the battery systems 10 and 310. However, the present invention is not limited thereto, and is applicable to any secondary battery, such as a nickel-cadmium storage battery or a nickel-hydrogen storage battery, including a BMU in a battery system.

(2) In the above-described embodiments, four lithium ion batteries are connected in series. However, the present invention is not limited thereto, and is applicable to a configuration in which five or more lithium ion batteries are connected in series.

(3) In the above-described embodiments, the communication connector 15 includes two terminals, i.e., the communication terminal 17 and the detection terminal 18. However, the present invention is not limited thereto, and is applicable to a configuration in which another terminal is provided in addition to the communication terminal and the detection terminal.

What is claimed is:

1. An energy storage system comprising:
   an energy storage device which is chargeable;
   a current cutoff unit configured to cut off a current of the energy storage device;
   a communication connector to be connected with an external communication connector;
   a detection terminal provided to the communication connector; and
   a control unit configured to control the current cutoff unit based on a connection state of the detection terminal of the communication connector when the communication connector is connected with the external communication connector,
   wherein the communication connector is connectable with the external communication connector provided to a vehicle having an identical charge voltage range and the external communication connector provided to a vehicle having a different charge voltage range,
   wherein the detection terminal is connectable with a power terminal for power supply provided to the external communication connector of the vehicle having the different charge voltage range and is capable of detecting power input, and
   wherein the control unit causes the current cutoff unit to cut off the current when the communication connector is connected with the external communication connector, the detection terminal is connected with the power terminal, and the power input is detected.

2. The energy storage system according to claim 1, wherein the control unit causes the current cutoff unit to cancel the cutoff of the current when the connection between the communication connector and the external communication connector is canceled, and the connection between the detection terminal and the power terminal is canceled.

3. The energy storage system according to claim 1, wherein the detection terminal is connectable with a ground terminal for grounding provided to the external communication connector of the vehicle having the identical charge voltage range, and wherein the control unit is configured to cancel the cutoff of the current at the current cutoff unit when the communication connector is connected with the external communication connector and a connection between the detection terminal and the ground terminal is detected.

4. The energy storage system according to claim 1, wherein the communication connector includes a communication terminal connectable with an external communication terminal provided to the external communication connector, and wherein the control unit causes the current cutoff unit to cut off the current when a cutoff signal from the external communication connector to the communication terminal is detected while the communication terminal is connected with the external communication terminal through the connection between the communication connector and the external communication connector.

5. An energy storage device monitoring unit, comprising:
a cutoff-unit drive unit configured to perform switching between cutoff and cutoff cancellation of a current of a chargeable energy storage device; and
a control unit configured to control the cutoff-unit drive unit based on a connection state of a detection terminal included in a communication connector when the communication connector is connected with an external communication connector,
wherein the detection terminal is configured to be connected to a ground terminal for grounding the external communication connector, and
wherein the control unit is configured to cancel the cutoff of the current at the current cutoff drive unit when the communication connector is connected with the external communication connector and a connection between the detection terminal and the ground terminal is detected.

6. A method of monitoring a chargeable energy storage device mounted on a vehicle, the method comprising:
cutting off a current between the energy storage device and the vehicle based on a connection state of a detection terminal provided to a communication connector when the communication connector is connected with an external communication connector of the vehicle,
wherein the detection terminal is configured to be connected to a ground terminal for grounding the external communication connector, and
wherein the cutting off comprises cancelling a cutoff of the current when the communication connector is connected with the external communication connector and a connection between the detection terminal and the ground terminal is detected.

7. The method of monitoring the energy storage device according to claim 6, wherein the communication connector is connectable with the external communication connector of the vehicle having an identical charge voltage range and the external communication connector of the vehicle having a different charge voltage range, and wherein the current is cut off when it is detected that the detection terminal is connected with a power terminal for power supply provided to the external communication connector of the vehicle having a different charge voltage range.

8. The method of monitoring the energy storage device according to claim 7, wherein it is detected that the detection terminal is connected with the power terminal by detecting change in voltage or current at the detection terminal.

9. The energy storage system according to claim 1, wherein, when the communication connector is connected with the external communication connector, the control unit determines whether power is input to the detection terminal of the communication connector.

10. The energy storage system according to claim 9, further comprising a voltage conversion unit coupled to the control unit and the detection terminal,
wherein, when the power is input to the detection terminal, the voltage conversion unit inputs a detection signal to the control unit and the control unit outputs a cutoff command to the current cutoff unit to cut off the current of the energy storage device.

11. The energy storage system according to claim 10, wherein, when the communication connector is connected with the external communication connector and no power is input to the detection terminal, a non-detection signal from the voltage conversion unit is continuously input to the control unit such that a current through an electrical power line between the energy storage device and an electrode terminal of the energy storage system is not cut off by the current cutoff unit.

12. The energy storage system according to claim 1, wherein the detection terminal is connectable with a ground terminal for grounding the external communication connector.

13. The energy storage system according to claim 12, wherein the control unit is configured to cancel the cutoff of the current at the current cutoff unit when a connection between the detection terminal and the ground terminal is detected.

14. The energy storage system according to claim 1, wherein the control unit is configured to cancel the cutoff of the current at the current cutoff unit when the communication connector is connected with the external communication connector and a connection is detected between the detection terminal and a ground terminal provided for grounding the external communication connector.

15. The energy storage device monitoring unit according to claim 5, wherein the ground terminal is provided in a vehicle having an identical charge voltage range.

\* \* \* \* \*